(12) United States Patent
Dreps et al.

(10) Patent No.: US 8,824,573 B2
(45) Date of Patent: Sep. 2, 2014

(54) DIGITAL PHASE DETECTOR WITH ZERO PHASE OFFSET

(71) Applicant: International Business Machines Corporation, Armonk, NY (US)

(72) Inventors: Daniel M. Dreps, Georgetown, TX (US); Kyu-hyoun Kim, Mount Kisco, NY (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/150,508

(22) Filed: Jan. 8, 2014

(65) Prior Publication Data

US 2014/0153682 A1     Jun. 5, 2014

Related U.S. Application Data

(62) Division of application No. 13/242,053, filed on Sep. 23, 2011.

(51) Int. Cl.
*H04L 27/00* (2006.01)

(52) U.S. Cl.
USPC .......................................................... 375/259

(58) Field of Classification Search
CPC ........ H03L 7/089; H03L 7/085; H03L 7/0814
USPC .......................................................... 375/259
See application file for complete search history.

(56) References Cited

U.S. PATENT DOCUMENTS

| 3,889,186 | A | 6/1975 | Larson |
| 4,814,726 | A | 3/1989 | Byrd et al. |
| 5,079,519 | A | 1/1992 | Ashby et al. |
| 5,126,690 | A | 6/1992 | Bui et al. |
| 5,166,641 | A | 11/1992 | Davis et al. |
| 6,493,394 | B2 | 12/2002 | Tamura et al. |
| 6,526,109 | B1 | 2/2003 | Chang et al. |
| 6,650,195 | B1 | 11/2003 | Brunn et al. |
| 6,661,862 | B1 | 12/2003 | Butcher |
| 6,952,462 | B2 * | 10/2005 | Harrison ........................ 375/373 |
| 7,023,243 | B2 | 4/2006 | Wijetunga et al. |

(Continued)

FOREIGN PATENT DOCUMENTS

JP     5100768 A     4/1993

*Primary Examiner* — Juan A Torres
(74) *Attorney, Agent, or Firm* — Joan Pennington

(57) ABSTRACT

An embodiment of the invention comprises a digital phase detector with substantially zero phase offset. The digital phase detector receives a clock signal and a reference clock signal and provides a phase indicator signal to identify whether the clock signal leads or lags the reference clock signal. An embodiment of the invention comprises a method that adds substantially zero phase offset in processing an input clock signal and a delayed clock signal to generate a control signal. The control signal is processed in a variable delay line to generate the delayed clock signal. In an embodiment, a first processor comprises a delay locked loop having a digital phase detector, the digital phase detector comprising a first differential sense amplifier cross-coupled to a second differential sense amplifier, the digital phase detector receiving a clock signal and generating one or more delayed clock signals, a control signal, and a gated data signal.

4 Claims, 13 Drawing Sheets

(56) References Cited

U.S. PATENT DOCUMENTS

| | | |
|---|---|---|
| 7,368,955 B2 | 5/2008 | Kiziloglu |
| 7,414,388 B2 | 8/2008 | Gilbert |
| 7,622,986 B2 | 11/2009 | Pan et al. |
| 7,778,374 B2 | 8/2010 | Jeon |
| 8,134,393 B1 | 3/2012 | Nagaraj et al. |
| 2007/0076831 A1 | 4/2007 | Griffin |
| 2009/0103675 A1 | 4/2009 | Moghaddam et al. |
| 2009/0134923 A1 | 5/2009 | Kwong et al. |
| 2010/0188125 A1 | 7/2010 | Booth et al. |
| 2013/0027100 A1* | 1/2013 | Yaghini et al. ............... 327/156 |

* cited by examiner

DIGITAL PHASE DETECTOR WITH ZERO PHASE OFFSET

This application is a divisional application of Ser. No. 13/242,053 filed Sep. 23, 2011.

FIELD

An embodiment of the invention generally relates to electronic circuits and more particularly to a digital phase detector with zero phase offset.

BACKGROUND

Phase detection is used in Delay-Locked Loop (DLL) and Phase-Locked Loop (PLL) circuits. A DLL circuit compares a phase of one of the outputs of the DLL circuit to an input clock, in order to generate an error signal, which is then integrated and fed back as the control to the delay elements. A PLL circuit compares the phase of an oscillator with an incoming signal, in order to generate an error signal, which is then integrated to create a control signal for the oscillator.

SUMMARY

An embodiment of the invention comprises an apparatus comprising a digital phase detector that has substantially zero phase offset. The digital phase detector is to receive a clock signal and a reference clock signal and to provide a phase indicator signal to identify whether the clock signal leads or lags the reference clock signal. An embodiment of the invention comprises a method to synchronize a delayed clock signal to an input clock signal. The method comprises adding substantially zero phase offset in processing the input clock signal and the delayed clock signal to generate a control signal. The control signal is processed in a variable delay line to generate the delayed clock signal. An embodiment of the invention comprises a communication system. The communication system comprises a first processor and a second processor coupled to the first processor. The first processor comprises a delay locked loop having a digital phase detector, the digital phase detector comprising a first differential sense amplifier cross-coupled to a second differential sense amplifier, the digital phase detector to receive a clock signal and to generate one or more delayed clock signals, a control signal, and a gated data signal. The second processor is to receive the control signal and the gated data signal.

It is to be noted, however, that the appended drawings illustrate only example embodiments of the invention, and are therefore not considered a limitation of the scope of other embodiments of the invention.

DETAILED DESCRIPTION

Figure 1:
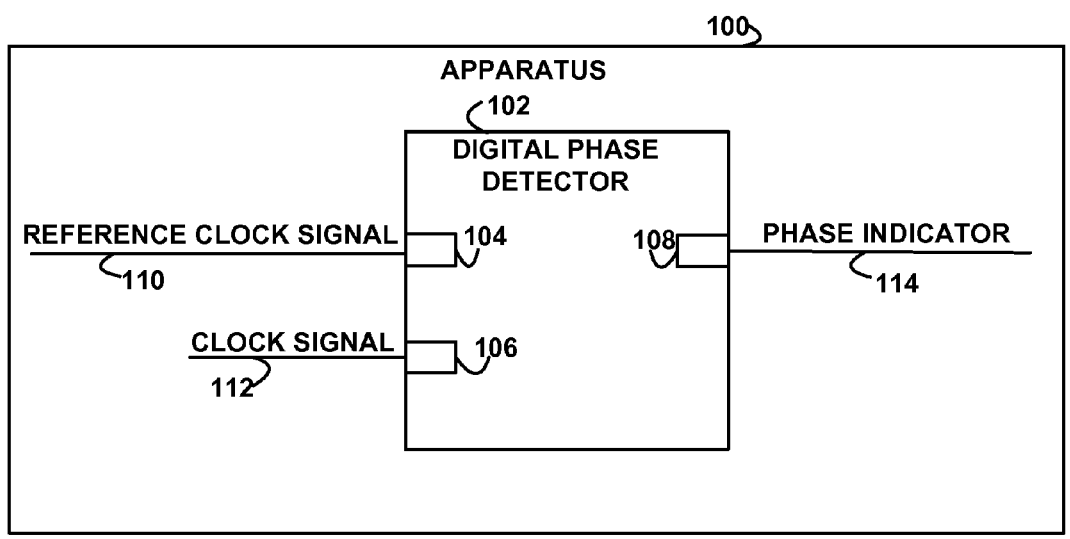
FIG. 1 depicts a block diagram of an apparatus comprising a digital phase detector, according to an embodiment of the invention.

Referring to the Drawings, wherein like numbers denote like parts throughout the several views, FIG. 1 depicts a block diagram of an apparatus 100 comprising a digital phase detector 102, according to an embodiment of the invention. The digital phase detector 102 comprises a reference clock signal port 104, a clock signal port 106, and a phase indicator signal port 108.

In operation, the digital phase detector 102 receives a reference clock signal 110 at the reference clock signal port 104, a clock signal 112 at the clock signal port 106, and provides a phase indicator signal 114 at the phase indicator signal port 108. In some embodiments, the reference clock signal 110, the clock signal 112, and the phase indicator signal 114 are digital signals taking on the logical values of zero or one. In some embodiments, the clock signal 112 and the reference clock signal 110 are substantially periodic signals of substantially the same frequency. The phase indicator signal 114 indicates whether the clock signal 112 leads or lags the reference clock signal 110. The clock signal 112 leads the reference clock signal 110 when the leading edge of the clock signal 112 occurs at a time before the leading edge of the reference clock signal 110. The clock signal 112 lags the reference clock signal 110 when the leading edge of the clock signal 112 occurs at a time after the leading edge of the reference clock signal 110. In some embodiments, the phase indicator signal 114 has a logical value of one when the clock signal 112 leads the reference clock signal 110 and a logical value of zero when the clock signal 112 lags the reference clock signal 110.

Figure 2:
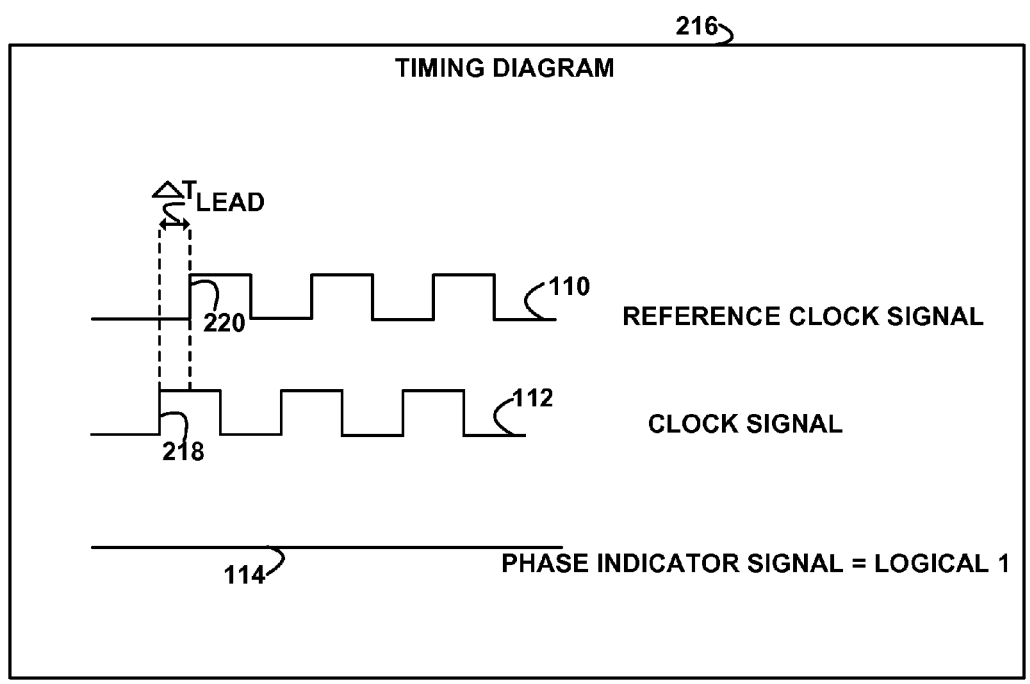
FIG. 2 depicts an example timing diagram for the apparatus, comprising exemplary waveforms for a reference clock signal, a clock signal, and a phase indicator signal, according to an embodiment of the invention.

FIG. 2 depicts an example timing diagram 216 for the apparatus 100, shown in FIG. 1, comprising exemplary waveforms for the reference clock signal 110, the clock signal 112, and the phase indicator signal 114, according to an embodiment of the invention, with each waveform having time on a horizontal axis and voltage on a vertical axis. As can be seen in FIG. 2, a leading edge 218 of the clock signal 112 leads a leading edge 220 of the reference clock signal 110 by a time of delta $T_{LEAD}$. In this embodiment, the phase indicator signal 114 has a logical value of one to indicate that the clock signal 112 leads the reference clock signal 110. Those skilled in the art will appreciate that the phase indicator signal 114 is not limited to being latched. Thus, in some embodiments, the phase indicator signal 114 is an unlatched pulse. In some embodiments, the phase indicator signal 114 is latched, as shown in FIG. 2.

Figure 3:
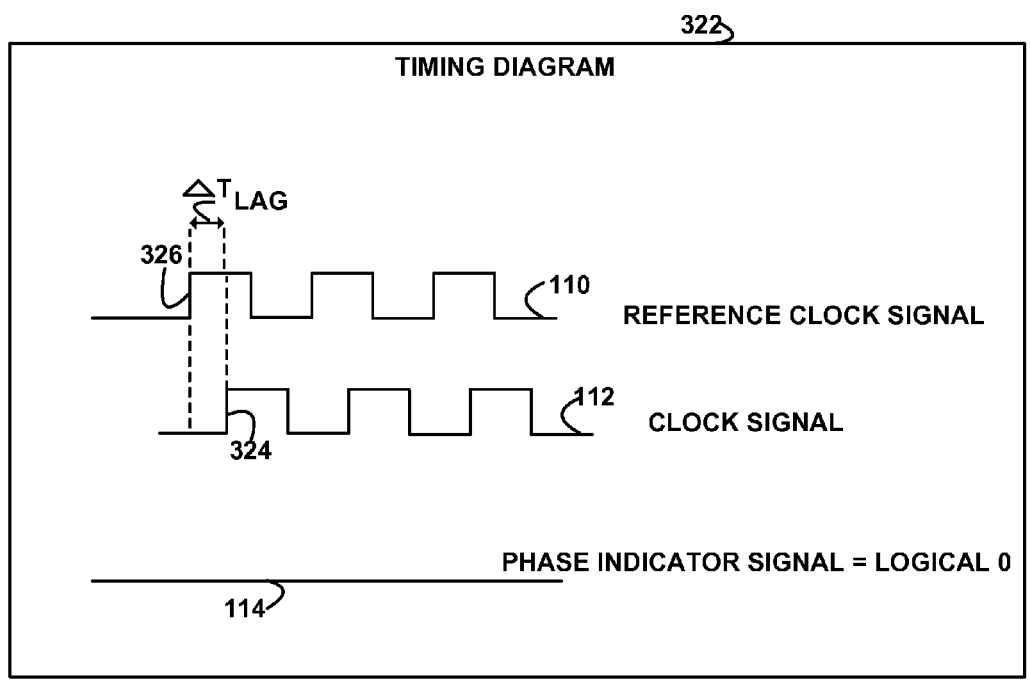
FIG. 3 depicts an example timing diagram for the apparatus, comprising exemplary waveforms for a reference clock signal, a clock signal, and a phase indicator signal, according to an embodiment of the invention.

FIG. 3 depicts an example timing diagram 322 including exemplary waveforms for the reference clock signal 110, the clock signal 112, and the phase indicator signal 114, according to an embodiment of the invention, with each waveform having time on a horizontal axis and voltage on a vertical axis. As can be seen in FIG. 3, a leading edge 324 of the clock signal 112 lags a leading edge 326 of the reference clock signal 110 by a time of delta $T_{LAG}$. In this embodiment, the phase indicator signal 114 has a logical value of 0 to indicate that the clock signal 112 lags the reference clock signal 110. Those skilled in the art will appreciate that the phase indicator signal 114 is not limited to being latched. Thus, in some embodiments, the phase indicator signal 114 is an unlatched pulse. And in some embodiments, the phase indicator signal 114 is latched, as shown in FIG. 3.

The phase indicator signal 114 provided at the phase indicator signal port 108 (FIG. 1) has substantially or essentially zero phase offset, which is illustrated as further described below with reference to the phase offset timing diagrams of FIGS. 4 and 5. In various embodiments, the phase offset of the phase indicator signal 114 is zero or is sufficiently close to zero, so that any difference from zero does not affect operation of the circuit that receives the phase indicator signal 114. In an embodiment, the phase indicator signal 114 has substantially or essentially zero phase offset when the phase offset is less than 0.1 ps (picoseconds). In an embodiment, the phase indicator signal 114 has substantially or essentially zero phase offset when any difference from zero is caused by transistor variability or mismatch (i.e., transistors that are specified to be the same size, but actually have different sizes due to manufacturing tolerances) instead of being caused by the circuit design.

Figure 4:
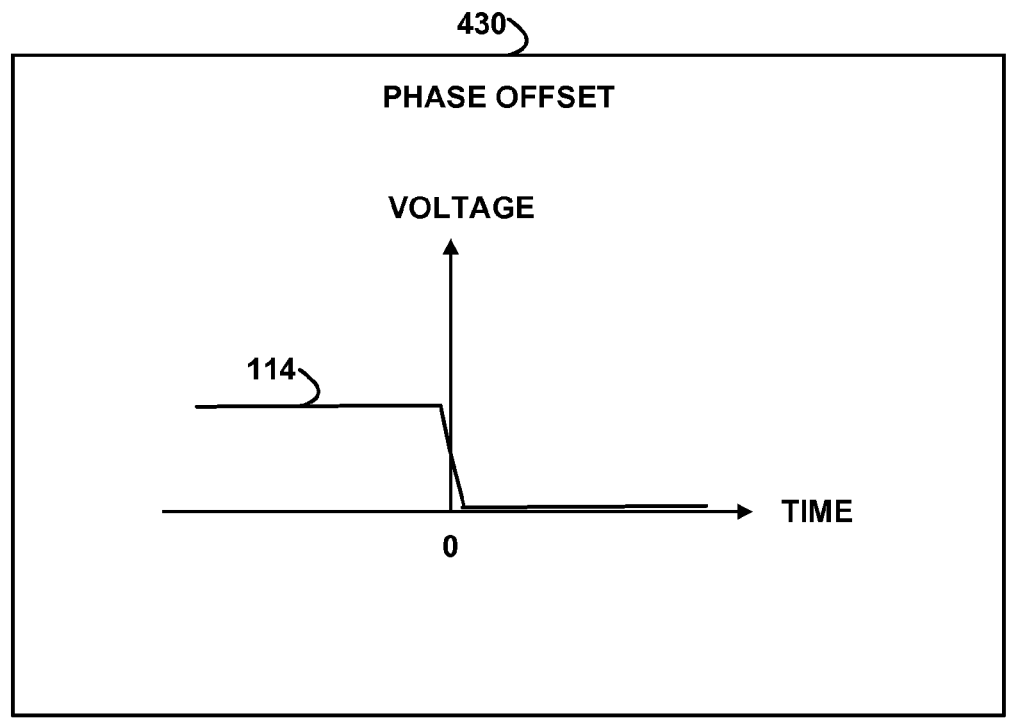
FIG. 4 depicts an example phase offset timing diagram, according to an embodiment of the invention.

FIG. 4 depicts a phase offset timing diagram 430, according to an embodiment of the invention, which shows a substantially zero phase offset in the phase indicator signal 114 generated as the clock signal 112 (FIGS. 2 and 3) transitions from leading to lagging the reference clock signal 110.

Figure 5:
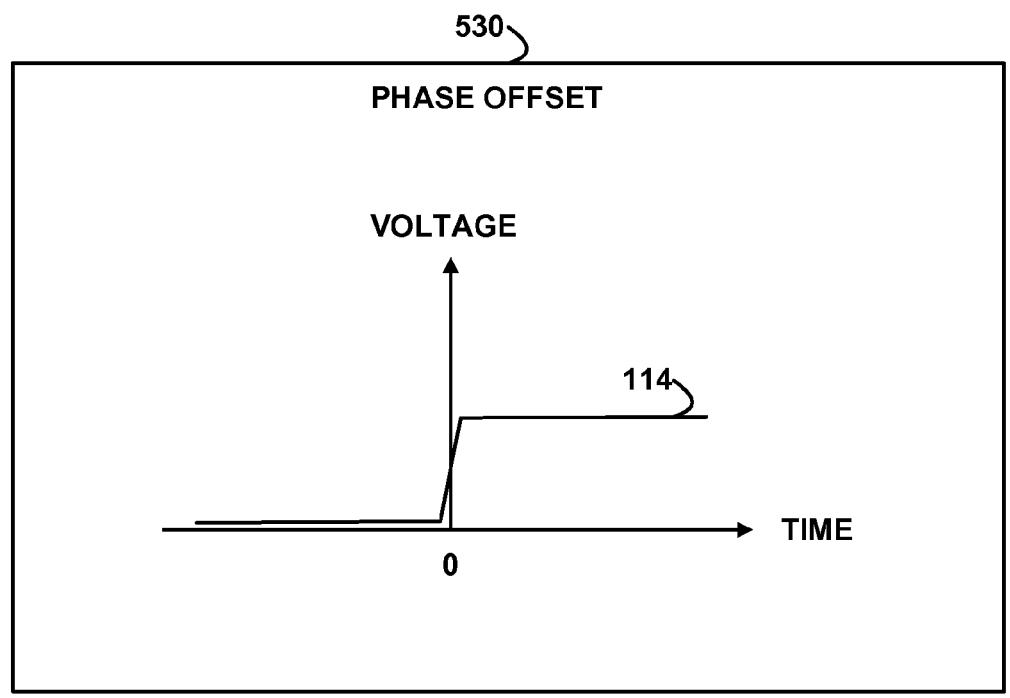
FIG. 5 depicts an example phase offset timing diagram, according to an embodiment of the invention.

FIG. 5 depicts a phase offset timing diagram 530, according to an embodiment of the invention, which depicts a substantially zero phase offset in the phase indicator signal 114 as the clock signal 112 (FIGS. 2 and 3) transitions from lagging to leading the reference clock signal 110.

The reference clock signal 110 is not limited to a particular type of signal or signaling method. In some embodiments, the reference clock signal 110 is a single ended reference clock signal suitable for use in single ended signaling. Single ended signaling is a method of electrically transmitting information by means of a signal on a single wire referenced to ground. In some embodiments, the reference clock signal 110 is a differential reference clock signal suitable for use in differential signaling. Differential signaling is a method of electrically transmitting information by means of two complementary signals sent on two separate wires.

The clock signal 112 is also not limited to a particular type of signal or signaling method. In some embodiments, the clock signal 112 is a single ended clock signal suitable for use in single ended signaling. In some embodiments, the clock signal 112 is a differential clock signal suitable for use in differential signaling.

Figure 6:
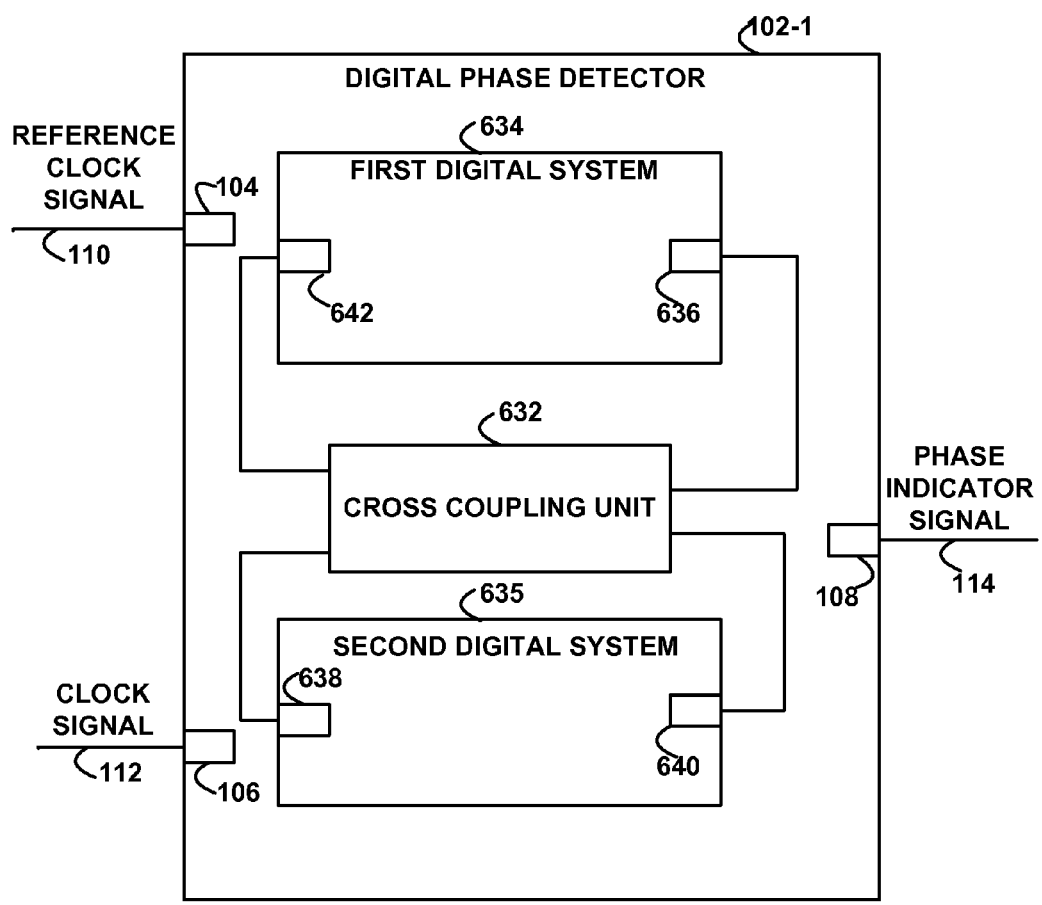
FIG. 6 depicts a block diagram of a digital phase detector, according to an embodiment of the invention.

FIG. 6 depicts a block diagram of a digital phase detector 102-1 comprising a cross-coupling unit 632 that cross-couples and connects a first digital system 634 to a second digital system 635. The digital phase detector 102-1 is an example of, and is generically referred to by, the digital phase detector 102 (FIG. 1). Referring again to FIG. 6, the cross-coupling unit 632 couples and connects one or more output signals at one or more output ports 636 of the first digital system 634 to one or more input ports 638 of the second digital system 635. The cross-coupling unit 632 also couples and connects one or more output signals of the second digital system 635 at one or more output ports 640 to one or more input ports 642 of the first digital system 634. In some embodiments, the cross-coupling unit 632 comprises conductors to couple signals from the first digital system 634 to the second digital system 635 and signals from the second digital system 635 to the first digital system 634.

In operation, the digital phase detector 102-1, as shown in FIG. 6, receives a reference clock signal 110 at the reference clock signal port 104, a clock signal 112 at the clock signal port 106, and provides a phase indicator signal 114 at the phase indicator signal port 108. In some embodiments, the reference clock signal 110, the clock signal 112, and the phase indicator signal 114 are digital signals taking on the logical values of zero or one. In some embodiments, the clock signal 112 and the reference clock signal 110 are substantially periodic signals of substantially the same frequency.

The phase indicator signal 114 indicates whether the clock signal 112 leads or lags the reference clock signal 110. The clock signal 112 leads the reference clock signal 110 when the leading edge of the clock signal 112 occurs at a time before the leading edge of the reference clock signal 110. The clock signal 112 lags the reference clock signal 110 when the leading edge of the clock signal 112 occurs at a time after the leading edge of the reference clock signal 110. In some embodiments, the phase indicator signal 114 assumes a logical value of one when the clock signal 112 leads the reference clock signal 110 and a logical value of zero when the clock signal 112 lags the reference clock signal 110. The digital phase detector 102-1 operates to provide the phase indicator signal 114 having substantially zero phase offset as described above with respect to FIGS. 1, 2, 3, 4, and 5.

Figure 7:
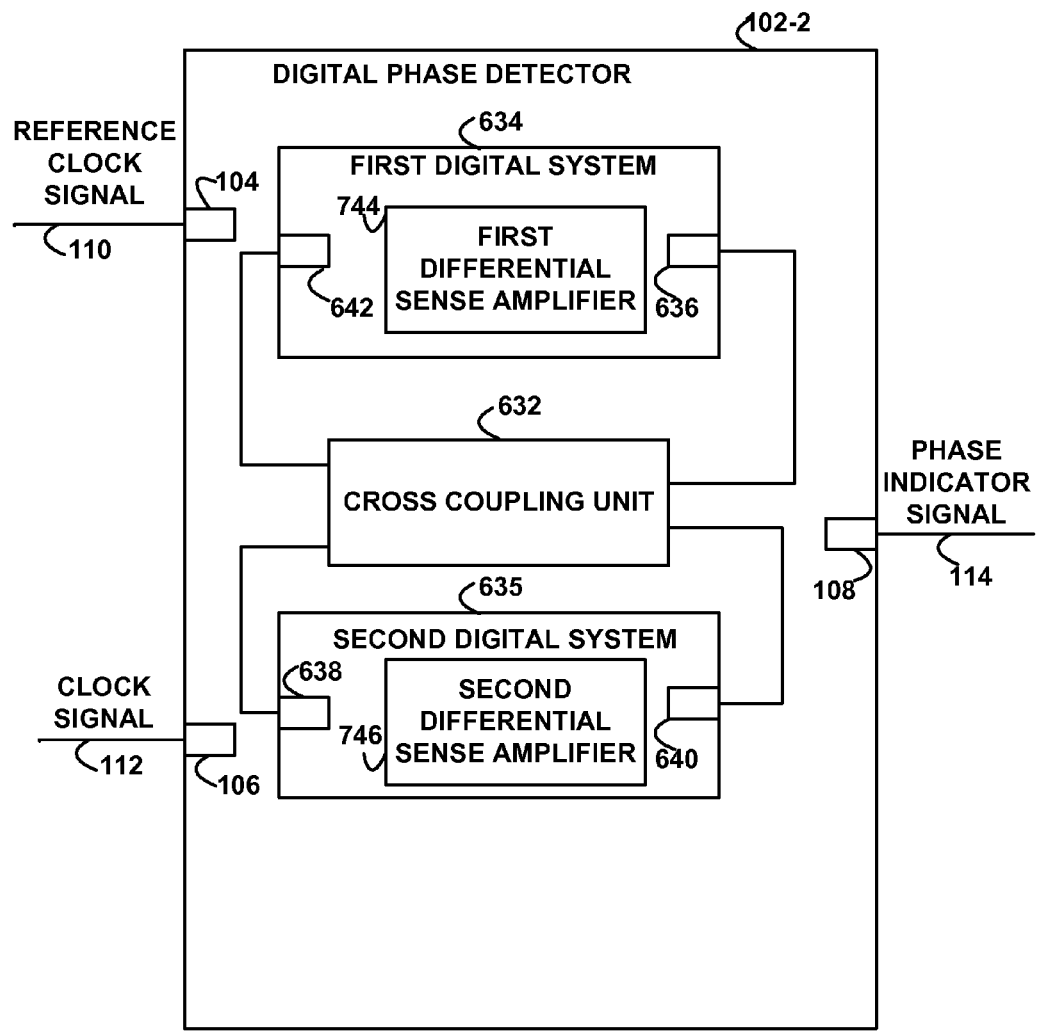
FIG. 7 depicts a block diagram of a digital phase detector, according to an embodiment of the invention.

FIG. 7 depicts a block diagram of a digital phase detector 102-2, according to an embodiment of the invention. The digital phase detector 102-2 is an example of, and is generically referred to by, the digital phase detector 102 (FIG. 1). Referring again to FIG. 7, a digital phase detector 102-2 comprises a first digital system 634, a second digital system 635, and a cross-coupling unit 632. The first digital system 634 comprises a first differential sense amplifier 744, and the second digital system 635 comprises a second differential sense amplifier 746. The cross-coupling unit 632 couples one or more output signals at one or more output ports 636 of the first digital system 634 to one or more input ports 638 of the second digital system 635. The cross-coupling unit 632 also couples one or more output signals of the second digital system 635 at one or more output ports 640 to one or more input ports 642 of the first digital system 634. In some embodiments, the cross-coupling unit 632 comprises conductors to couple signals from the first digital system 634 to the second digital system 635 and signals from the second digital system 635 to the first digital system 634.

In operation, the digital phase detector 102-2, as depicted in FIG. 7, receives a reference clock signal 110 at the reference clock signal port 104, a clock signal 112 at the clock signal port 106, and provides a phase indicator signal 114 at the phase indicator signal port 108. In some embodiments, the reference clock signal 110, the clock signal 112, and the phase indicator signal 114 are digital signals taking on the logical values of zero or one. In some embodiments, the clock signal 112 and the reference clock signal 110 are substantially periodic signals of substantially the same frequency. The phase indicator signal 114 indicates whether the clock signal 112 leads or lags the reference clock signal 110.

The clock signal 112 leads the reference clock signal 110 when the leading edge of the clock signal 112 occurs at a time before the leading edge of the reference clock signal 110. The clock signal 112 lags the reference clock signal 110 when the leading edge of the clock signal 112 occurs at a time after the leading edge of the reference clock signal 110. In some embodiments, the phase indicator signal 114 assumes a logical value of one when the clock signal 112 leads the reference clock signal 110 and a logical value of zero when the clock signal 112 lags the reference clock signal 110. The digital phase detector 102-2 operates to provide the phase indicator signal 114 having substantially zero phase offset as described above with respect to FIGS. 1, 2, 3, 4, and 5.

Figure 8:
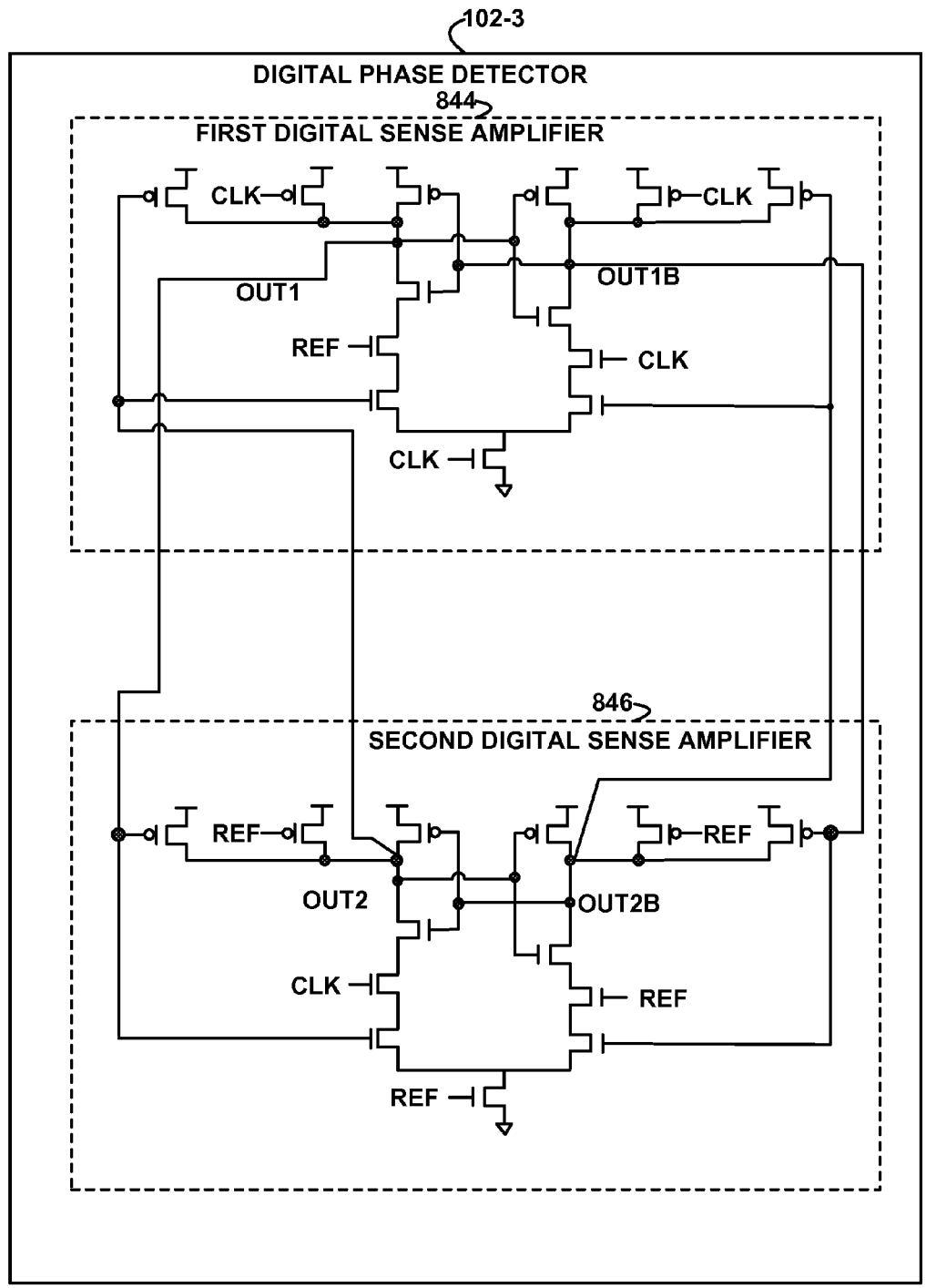
FIG. 8 depicts a schematic diagram of a digital phase detector comprising two cross-coupled differential sense amplifiers, according to an embodiment of the invention.

FIG. 8 depicts a schematic diagram of a digital phase detector 102-3 comprising two cross-coupled differential sense amplifiers 844 and 846, according to an embodiment of the invention. The outputs of the differential sense amplifier 844 are connected to the inputs of the differential sense amplifier 846, and the outputs of the differential sense amplifier 846 are connected to the inputs of the differential sense amplifier 844. The digital phase detector 102-3 is an example of, and is generically referred to by, the digital phase detector 102 (FIG. 1). Referring again to FIG. 8 the CLK signal is a single ended signal equivalent to the clock signal 112 shown in FIG. 1, and the REF signal shown in FIG. 8 is equivalent to the reference clock signal 110 shown in FIG. 1. The signals OUT1 and OUT1B are equivalent to the phase indicator signal 114 shown in FIG. 1. Those skilled in the art will appreciate that OUT1 and OUT1B may drive a set-reset latch to form a latched signal indicating whether the CLK signal leads or lags the REF signal. The OUT2 and OUT2B signals provide a complementary signal to the phase indicator signal 114 generated at a set-reset latch controlled by the OUT1 and OUT1B signals. In an embodiment, the first differential sense amplifier 844 and the second differential sense amplifier 846 may implement the first differential sense amplifier 744 and the second differential sense amplifier 746 (FIG. 7), respectively.

Figure 9:
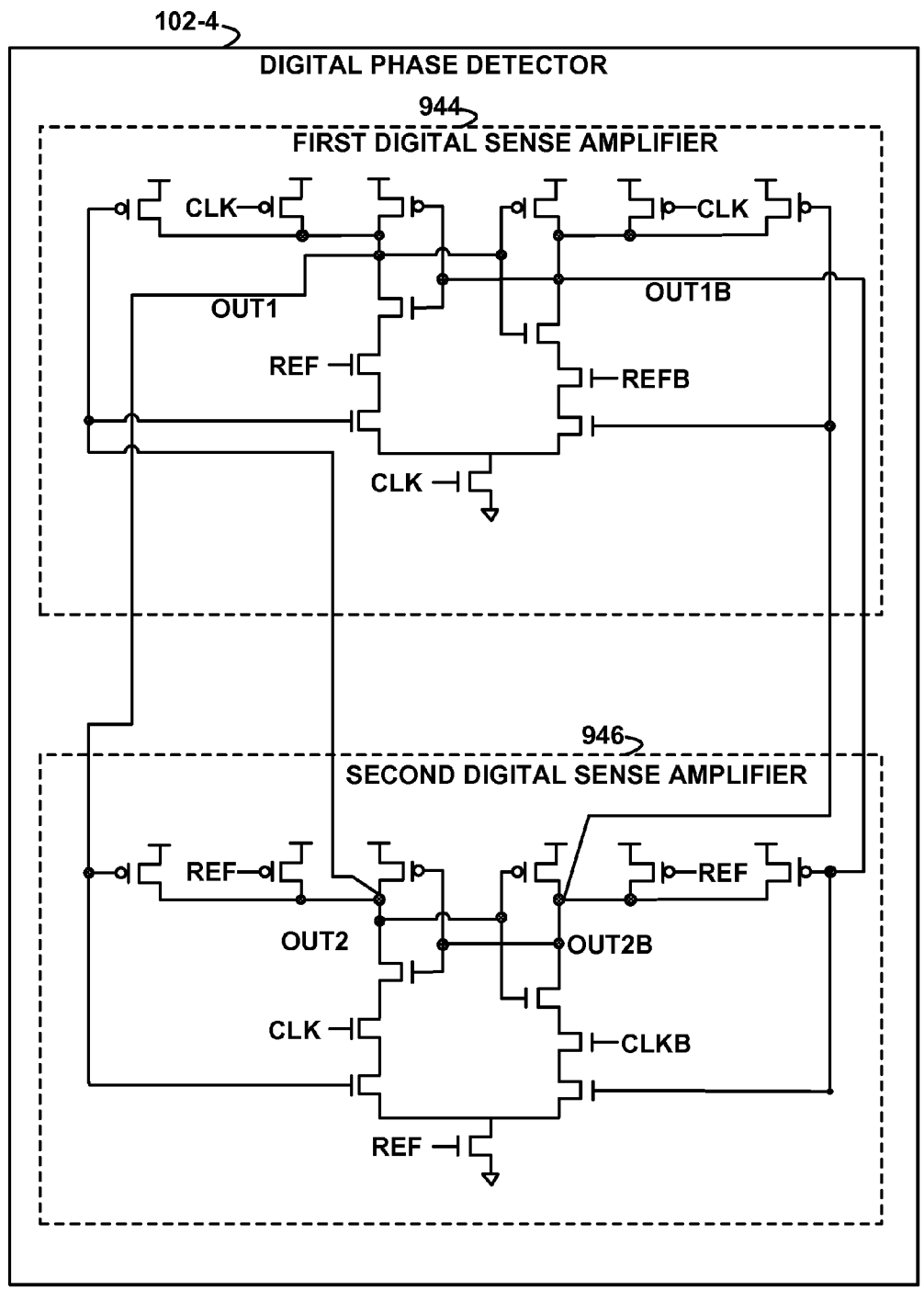
FIG. 9 depicts a schematic diagram of a digital phase detector comprising two cross-coupled differential sense amplifiers, according to an embodiment of the invention.

FIG. 9 depicts a schematic diagram of a digital phase detector 102-4 comprising two cross-coupled differential sense amplifiers 944 and 946, according to an embodiment of the invention. The outputs of the differential sense amplifier 944 are connected to the inputs of the differential sense amplifier 946, and the outputs of the differential sense amplifier 946 are connected to the inputs of the differential sense amplifier 944. The digital phase detector 102-4 is an example of, and is generically referred to by, the digital phase detector 102 (FIG. 1). Referring again to FIG. 9, the CLK and CLKB signals form a differential signal equivalent to the clock signal 112 shown in FIG. 1, and the REF and REFB signals form a differential signal equivalent to the reference clock signal 110 shown in FIG. 1. The OUT1 and OUT1B signals and the OUT2 and OUT2B signals are equivalent to the signals having the same name in FIG. 8, as previously described above. In an embodiment, the first differential sense amplifier 944 and the second differential sense amplifier 946 may implement the first differential sense amplifier 744 and the second differential sense amplifier 746 (FIG. 7), respectively.

As shown in FIG. 8, the reference clock signal and the clock signal received at the digital phase detector 102-3 are single ended signals. As shown in FIG. 9, the reference clock signal and the clock signal received at the digital phase detector 102-4 are differential signals.

Figure 10:
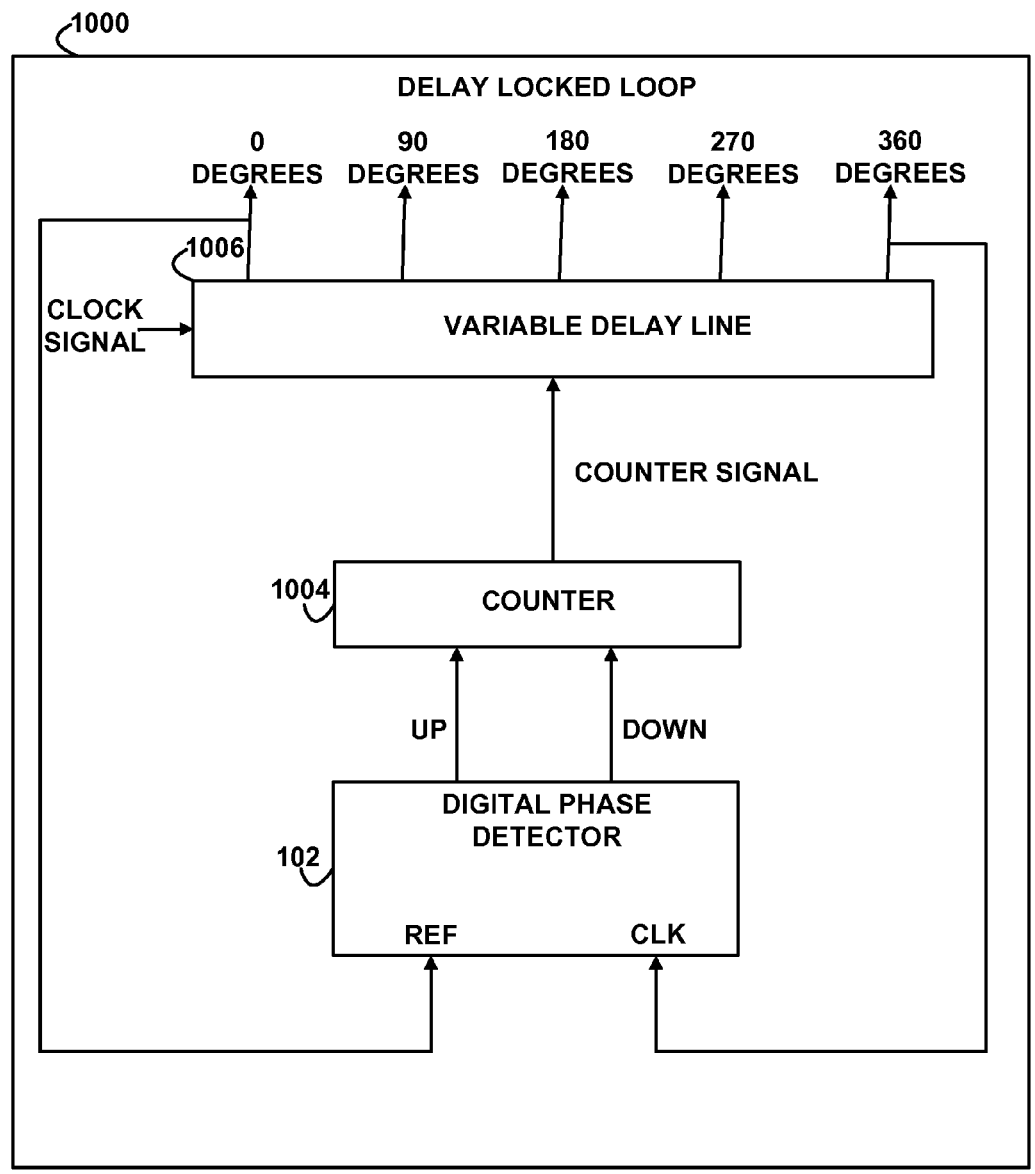
FIG. 10 depicts a circuit diagram of an exemplary delay locked loop comprising a digital phase detector, according to an embodiment of the invention.

FIG. 10 depicts a circuit diagram of an exemplary delay locked loop 1000 comprising a digital phase detector 102, according to an embodiment of the invention. In addition to the digital phase detector 102, the delay locked loop 1000 comprises a counter 1004 connected to the digital phase detector 102 and a variable delay line 1006 connected to the counter 1004 and the digital phase detector 102. In some embodiments, the counter 1004 is an up-down counter that counts up in response to an UP signal received from the digital phase detector 102 and counts down in response to a DOWN signal received from the digital phase detector 102. The UP signal and the DOWN signal couple the digital phase detector 102 to the counter 1004. The counter signal couples the counter to the variable delay line 1006. The 0 degree signal and the 360 degree signal couple the variable delay line 1006 to the digital phase detector 102. In an embodiment, the variable delay line 1006 is implemented as a digital delay line.

In operation, the variable delay line 1006 receives a clock signal and a counter signal. The counter signal provides count information to the variable delay line 1006. Count information indicates how much or how often the clock signal leads or lags the 360 degree clock signal. In some embodiments, the count information is serial information provided on a signal serial line. In some embodiments, the count information is parallel information provided on one or more signal lines. The count information is used by the variable delay line 1006 to determine a delay time for the clock signal, in proportion to the count information. The variable delay line 1006 provides a 0 degree clock signal, a 90 degree clock signal, a 180 degree clock signal, a 270 degree clock signal and a 360 degree clock signal. The 0 degree clock signal is a representation of the clock signal delayed by about zero degrees. The 90 degree clock signal is a representation of the clock signal delayed by about 90 degrees. The 180 degree clock signal is a representation of the clock signal delayed by about 180 degrees. The 270 degree clock signal is a representation of the clock signal delayed by about 270 degrees. The 360 degree clock signal is a representation of the clock signal delayed by about 360 degrees. The 0 degree clock signal and the 360 degree clock signal are provided to the digital phase detector 102 as the reference clock signal (REF) and the clock signal (CLK), respectively.

The digital phase detector 102 processes the 360 degree clock signal and the 0 degree clock signal to provide an UP count signal and a DOWN count signal to the counter 1004. In some embodiments, the digital phase detector 102 provides an UP count signal when, or each time, the clock signal lags the 360 clock signal and provides a DOWN count signal when, or each time, the clock signal leads the 360 clock signal. The counter signal controls the delay of the variable delay line 1006 to provide the 0 degree clock signal, the 90 degree clock signal the 180 degree clock signal, the 270 degree clock signal, and the 360 degree clock signal. In an embodiment, the UP and DOWN count signals are provided by the phase indicator signal 114 (FIG. 1).

Figure 11:
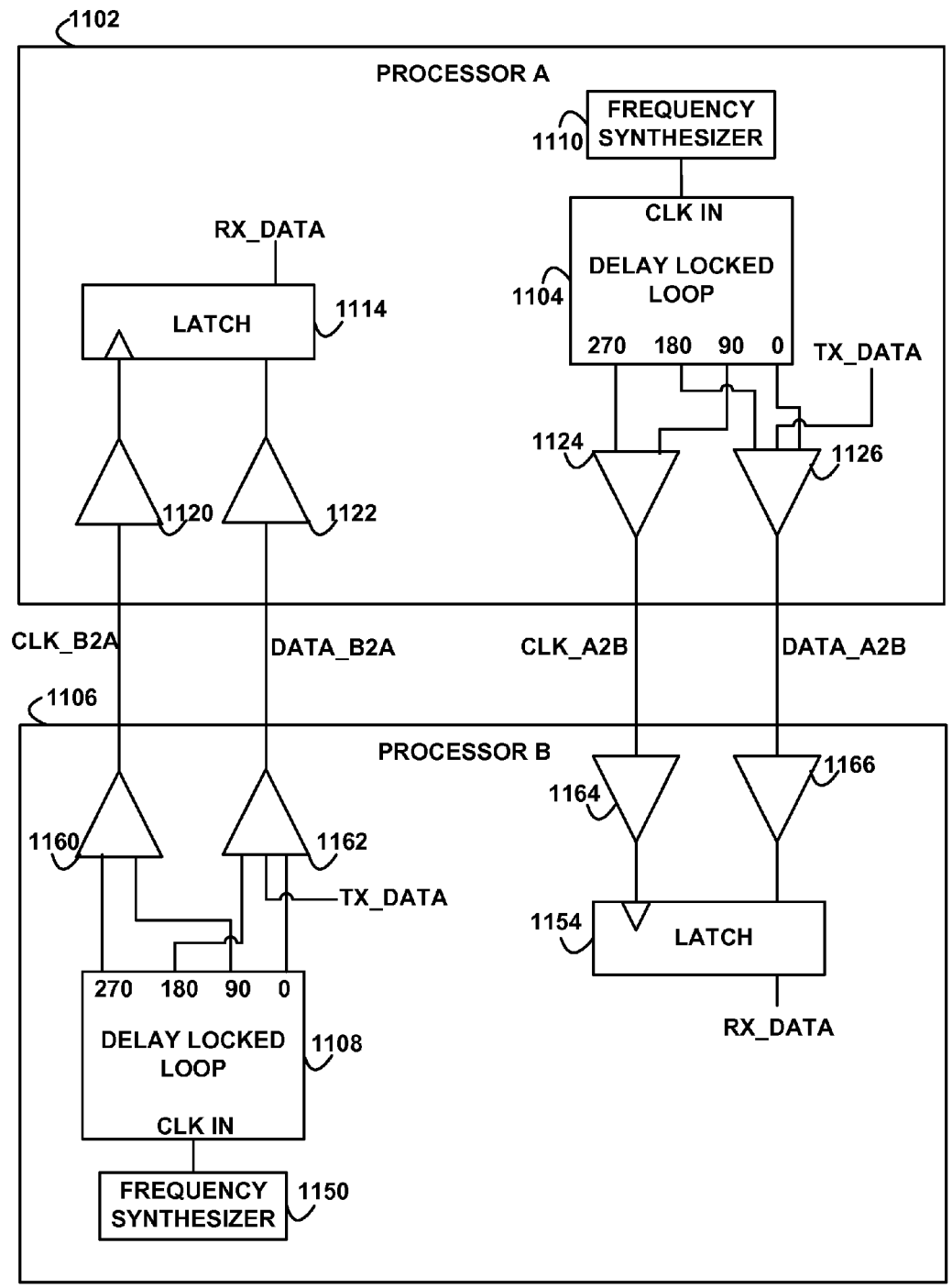
FIG. 11 depicts a block diagram of a communication system coupling a processor comprising a delay locked loop to a processor comprising a delay locked loop, according to an embodiment of the invention.

FIG. 11 depicts a block diagram of a communication system, according to an embodiment of the invention. The communication system couples a processor A 1102, comprising a delay locked loop 1104, to a processor B 1106, comprising a delay locked loop 1108. In an embodiment, the delay locked loops 1104 and 1108 may be implemented via the delay locked loop 1000, as previously described above with reference to FIG. 10. The delay locked loop 1104 is driven by a clock signal provided by a frequency synthesizer 1110. The delay locked loop 1108 is driven by a clock signal provided by the frequency synthesizer 1150. As shown in FIG. 11, the delay locked loop 1104 couples the processor A 1102 to the processor B 1106 by providing signals generated at the processor A 1102, such as the CLK_A2B signal and the DATA_A2B signal, to the processor B 1106. The delay locked loop 1108 couples the processor B 1106 to the processor A 1102 by providing signals generated at the processor B 1106, such as the CLK_B2A signal and the DATA_B2A signal, to the processor A 1102.

In operation, the TX_DATA signal of the processor A 1102 is gated by the 0 degree signal and the 180 degree signal at the logic 1126 of the delay locked loop 1104 to the processor B 1106. A CLK_A2B signal is formed from the 90 degree delay signal and the 270 degree delay signal and the logic 1124 to provide latching of the DATA_A2B signal at the processor B 1106. The CLK_A2B signal is further processed by logic 1164 at the processor B 1106. The DATA_A2B signal is further processed by logic 1166 at the processor B 1106. The RX_DATA signal is stored and provided as an output signal at latch 1154.

In some embodiments, the TX_DATA signal of the processor B 1106 is gated by the 0 degree signal and the 180 degree signal and logic 1162 of the delay locked loop 1108 to the processor A 1102. A CLK_B2A signal is formed from the 90 degree delay signal and the 270 degree delay signal and logic 1160 to provide latching of the DATA_B2A signal at the processor A 1102. The CLK_B2A signal is further processed by logic 1120 at the processor A 1102. The DATA_B2A signal is further processed by logic 1122 at the processor A 1102. The RX_DATA is stored and provided as an output signal at the latch 1114.

Figure 12:
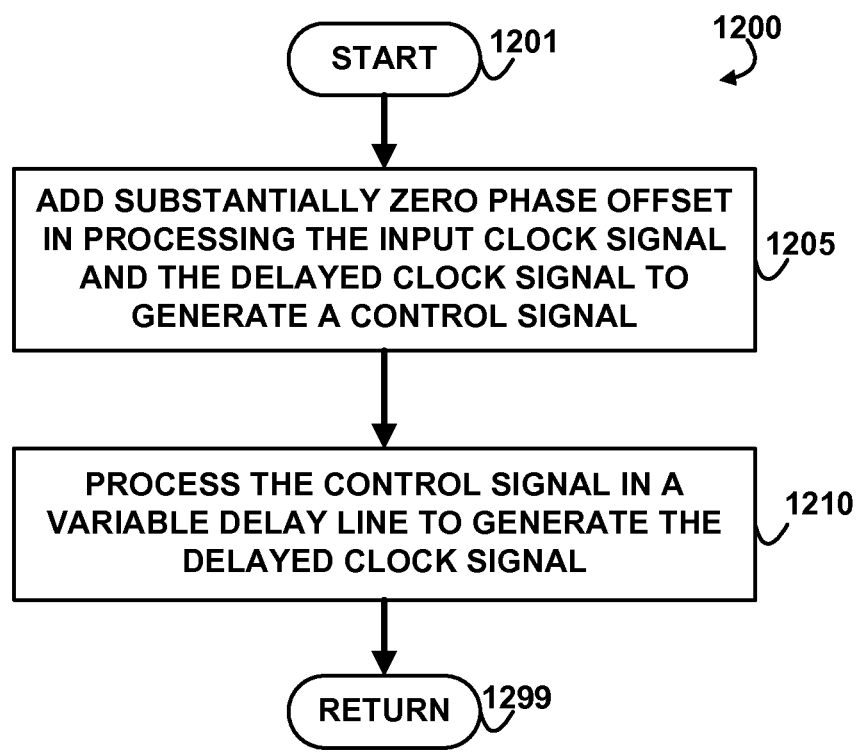
FIG. 12 depicts a flowchart of an example method to synchronize a delayed clock signal to an input clock signal, according to an embodiment of the invention.

FIG. 12 depicts a flowchart of an example method 1200 to synchronize a delayed clock signal to an input clock signal, according to an embodiment of the invention. Control begins at block 1201. Control then continues to block 1205, where the method 1200 comprises adding substantially zero phase offset in processing the input clock signal and the delayed clock signal to generate a control signal. Control then continues to block 1210 where the method 1200 comprises processing the control signal in a variable delay line to generate the delayed clock signal. Control then continues to block 1299 where the method returns.

In some embodiments, the input clock signal is a periodic digital signal, for example, a square wave having a duty cycle of 50% and a frequency of about 2.8 megahertz. In synchronizing the delayed clock signal to the input clock signal the method 1200 adjusts the phase and frequency of the delayed clock signal to substantially track the phase and frequency of the clock signal.

In some embodiments, adding substantially zero phase offset in processing the input clock signal and the delayed clock signal to generate a control signal comprises receiving the input clock signal and the delayed clock signal at a cross-coupled pair of differential sense amplifiers to generate a count-up control signal and a count-down control signal.

In some embodiments, processing the input clock signal and the delayed clock signal to generate the control signal comprises driving a counter coupled to the variable delay line with the count-up control signal and the count-down control signal to generate the delayed clock signal.

In some embodiments, processing the control signal in the variable delay line to generate the delayed clock signal comprises receiving the input clock signal at the variable delay line having a delay and increasing the delay or decreasing the delay to substantially synchronize the delayed clock signal to the input clock signal.

Those skilled in the art will appreciate that that the method shown in FIG. 12 may be implemented in a digital system as shown in the block diagrams of FIGS. 1, 6, 7, 8, 9, 10, and 11. For example, the input clock signal may be equivalent to CLK IN from the frequency synthesizers 1110 and 1150 of FIG. 11; the control signals may be equivalent to the counter signal or the UP and DOWN signals of FIG. 10; the delayed clock signal may be equivalent to the 360 degree output of the variable delay line in FIG. 10; and the gated data signals may be equivalent to the DATA_A2B and DATA_B2A outputs of the logic 1126 and 1162 of FIG. 11.

Figure 13:
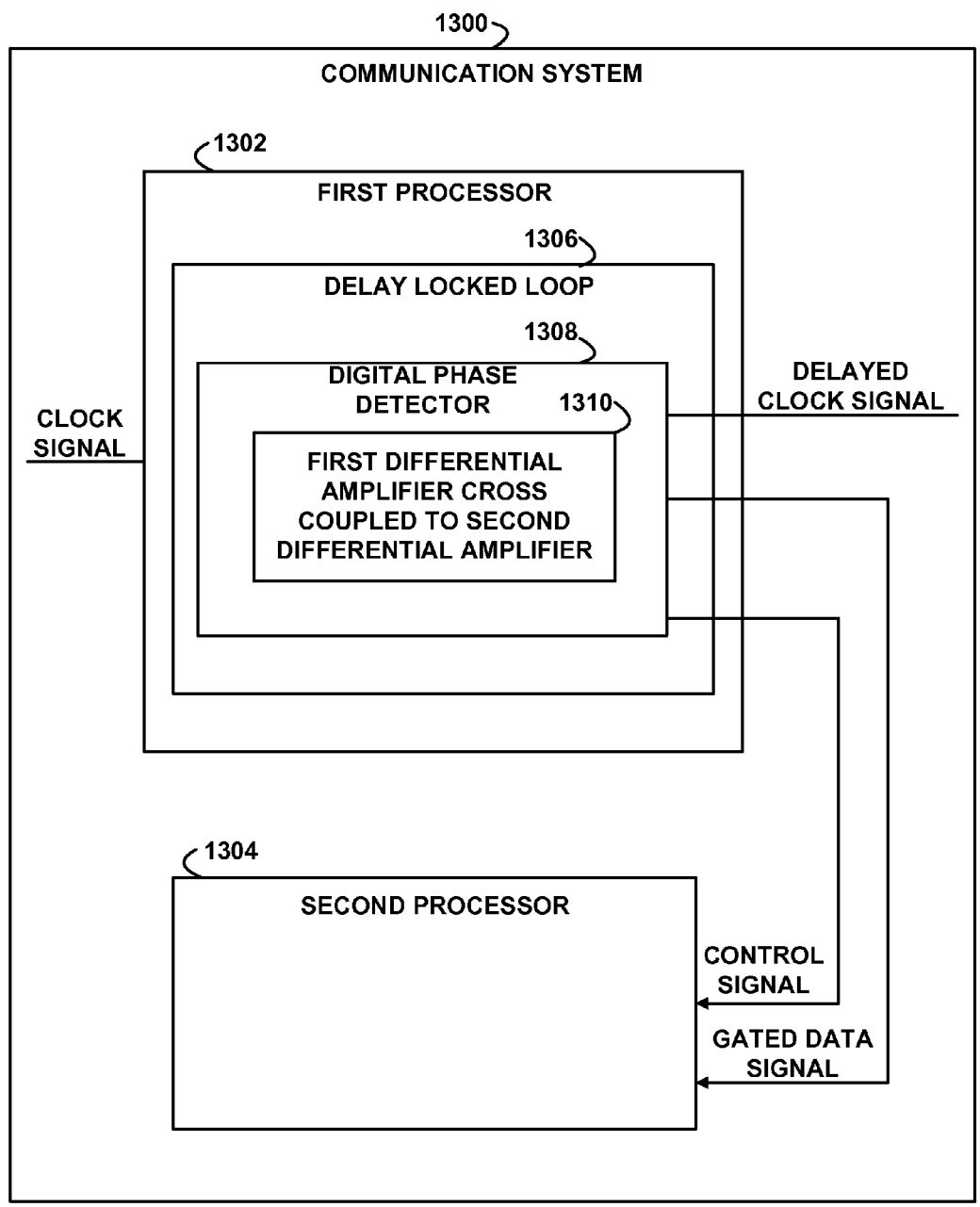
FIG. 13 depicts a block diagram of a communication system, according to an embodiment of the invention.

FIG. 13 depicts a block diagram of a communication system 1300, according to an embodiment of the invention. The communication system 1300 comprises a first processor 1302 and a second processor 1304. The first processor 1302 and the second processor 1304 are examples of the processor A 1102 (FIG. 11) and the processor B 1106 (FIG. 11), respectively. Referring again to FIG. 13, the first processor 1302 comprises a delay locked loop 1306 having a digital phase detector 1308. The digital phase detector 1308 comprises a first differential sense amplifier cross-coupled to a second differential sense amplifier 1310. The control signal and the gated data signal couples the first processor 1302 to the second processor 1304.

In operation, the digital phase detector 1308 receives a clock signal and generates a gated data signal and a control signal. The second processor 1304 receives the control signal and the gated data signal.

Figure 14:
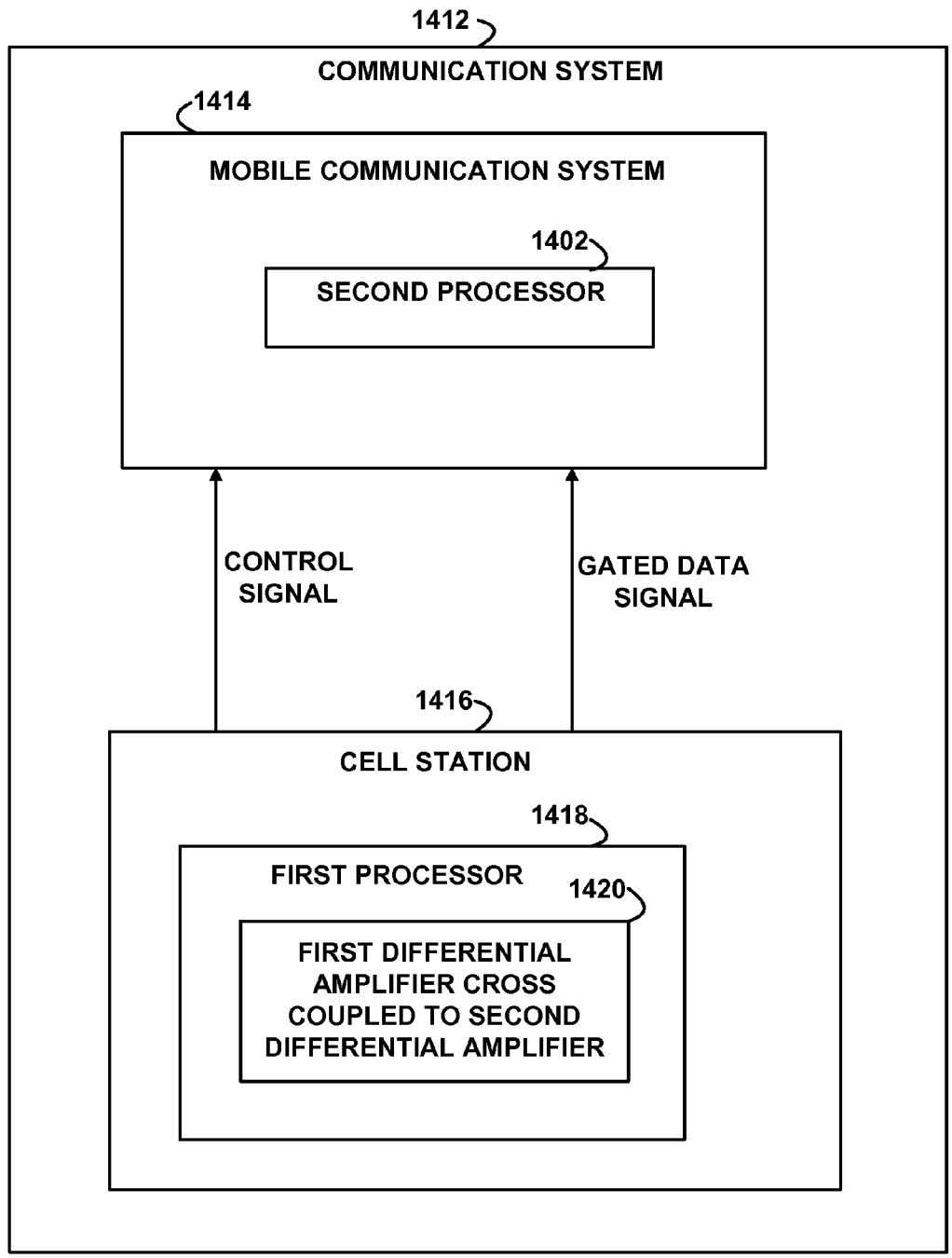
FIG. 14 depicts a block diagram of a communication system, according to an embodiment of the invention.

FIG. 14 depicts a block diagram of a communication system 1412, according to an embodiment of the invention. The communication system 1412 comprises a mobile communication system 1414, such as a cellular communication system handset, comprising a second processor 1402, and a cell station 1416 comprising a first processor 1418 that comprises a first differential amplifier cross coupled to a second differential amplifier 1420.

In operation, the first processor 1418 of the cell station 1416 is connected to and provides a control signal and a gated data signal to the mobile communication system 1414. In some embodiments, the cell station 1416 is a cell station in a cellular communication system.

Those skilled in the art will appreciate that the elements of FIGS. 1, 2, 3, 4, 5, 6, 7, 8, 9, 10, 11, 12, 13, and 14, including but not limited to the digital phase detectors 102, 102-1, 102-2, 102-3, and 102-4, the delay locked loop 1000, the processors 1102 and 1106, the method 1200, the communication system 1300, and the communication system 1412 are not limited to being implemented in a particular electronic technology. In some embodiments, the elements are fabricated using transistors formed using a complementary metal-oxide-semiconductor process. The term "metal-oxide-semiconductor" comprises field-effect transistors having a metal gate electrode placed on an oxide insulator formed on a semiconductor material. The resulting integrated circuit chips may be distributed by a fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multi-chip package (such as a ceramic carrier that has either or both surface interconnections or buried interconnections). In any case, the chip then may be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications, to hand-held devices, to advanced computer products having a display, a keyboard, or other input device, and a central processor such as telephones, notebook computers, tablet computers, laptop computers, server computers, and communication systems.

The terminology used herein is for the purpose of describing particular embodiments only and is not intended to be limiting of the invention. As used herein, the singular forms "a," "an," and "the" are intended to comprise the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention.

In the previous description, numerous specific details were set forth to provide a thorough understanding of embodiments of the invention. But, embodiments of the invention may be practiced without these specific details. In other instances, well-known circuits, structures, and techniques have not been shown in detail in order not to obscure embodiments of the invention. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure is not necessary. The previous detailed description is, therefore, not to be taken in a limiting sense.

What is claimed is:

1. A communication system comprising:
    a first processor comprising a delay locked loop having a digital phase detector, the digital phase detector comprising a first differential sense amplifier cross-coupled to a second differential sense amplifier, the digital phase detector to receive a clock signal and to generate one or more delayed clock signals, a control signal, and a gated data signal; and
    a second processor coupled to the first processor, the second processor to receive the control signal and the gated data signal.

2. The communication system of claim 1, wherein the second processor is included in a mobile communication system.

3. The communication system of claim 1, wherein the first processor is included in a cell station.

4. The communication system of claim 1, wherein the digital phase detector has substantially zero phase offset.

* * * * *